US006960094B2

United States Patent
Tomonari et al.

(10) Patent No.: US 6,960,094 B2
(45) Date of Patent: Nov. 1, 2005

(54) FLAT AND THIN CONNECTOR FOR ELECTRICALLY CONNECTING A FLEXIBLE PRINTED CIRCUIT BOARD AND A HARD BOARD

(75) Inventors: Ohtsuki Tomonari, Shinagawa-Ku (JP); Yamazaki Yasue, Shinagawa-Ku (JP)

(73) Assignee: DDK Ltd., Tokyo (JP)

( * ) Notice: Subject to any disclaimer, the term of this patent is extended or adjusted under 35 U.S.C. 154(b) by 0 days.

(21) Appl. No.: 10/752,750

(22) Filed: Jan. 6, 2004

(65) Prior Publication Data

US 2004/0157482 A1 Aug. 12, 2004

(30) Foreign Application Priority Data

| Feb. 6, 2003 | (JP) | 2003-029198 |
| Apr. 24, 2003 | (JP) | 2003-119167 |
| Apr. 24, 2003 | (JP) | 2003-119213 |
| May 23, 2003 | (JP) | 2003-145829 |
| May 23, 2003 | (JP) | 2003-145835 |

(51) Int. Cl.$^7$ ............................................. H01R 13/62
(52) U.S. Cl. ...................................... 439/329; 439/493
(58) Field of Search .................. 439/329, 77, 492–499, 439/67

(56) References Cited

U.S. PATENT DOCUMENTS

| 4,639,063 A | * | 1/1987 | Mueller ....................... 439/325 |
| 4,640,562 A | * | 2/1987 | Shoemaker .................. 439/77 |
| 4,691,972 A | * | 9/1987 | Gordon ........................ 439/77 |
| 4,770,645 A | * | 9/1988 | Antes .......................... 439/329 |
| 4,776,806 A | * | 10/1988 | Adams ......................... 439/67 |
| 5,499,924 A | * | 3/1996 | Arisaka et al. .............. 439/67 |
| 6,247,951 B1 | * | 6/2001 | Di Liello et al. ........... 439/329 |
| 6,345,998 B1 | * | 2/2002 | Lee ............................. 439/260 |
| 6,595,796 B1 | * | 7/2003 | Koegel et al. .............. 439/495 |

* cited by examiner

Primary Examiner—Michael C. Zarroli
(74) Attorney, Agent, or Firm—Baker Botts LLP

(57) ABSTRACT

A flat and thin connector for electrically connecting a flexible printed circuit board and a hard board. The connector includes a mounting member fixed to the hard board, and a pusher member cooperating with said mounting member. The pusher member urges the printed circuit board against the hard board by aid of an elastic member. Further, the printed circuit board is provided with slits between the bump contacts to facilitate a uniform pushing force.

17 Claims, 13 Drawing Sheets

FLAT AND THIN CONNECTOR FOR ELECTRICALLY CONNECTING A FLEXIBLE PRINTED CIRCUIT BOARD AND A HARD BOARD

BACKGROUND OF THE INVENTION

The present invention relates to a connector for use in a mobile or cellular phone, notebook personal computer, digital camera and the like, more particularly to a connector for connecting a flexible printed circuit board and a hard board, which is intended to be more miniaturized and flattened and thinner, and more particularly to a mounting member used for connecting the flexible printed circuit board to the hard board, which contributes to the miniaturization of flattened and thinner connector and a method for mounting the mounting member on the hard board.

One kind of the connector used in a mobile phone, charge coupled device (CCD) camera and the like mainly comprises a housing and contacts, and when a flexible printed circuit board is inserted into the housing, it is brought into contact with contact portions of the contacts. This type of connector is so-called "non-zero-insertion force" (NZIF) type. A connector of the other kind mainly comprises a housing, contacts and a slider so that a flexible printed circuit board is embraced by the housing and the slider (so-called "zero-insertion force" (ZIF) type and "piano touch" type). There are various methods for holding the flexible printed circuit board by the housing and the slider. In many cases, however, after a flexible printed circuit board has been inserted into the housing, the slider is inserted into the housing to urge the flexible printed circuit board against contacts, or after a flexible printed circuit board has been inserted, a slider is pivotally moved to urge a flexible printed circuit board to contacts.

The housing is formed with a required number of insertion apertures for inserting the contacts therein and a fitting hole for inserting the flexible printed circuit board. The contacts mainly comprise a contact portion adapted to contact a flexible printed circuit board, a connection portion to be connected to a hard board, and a fixing portion to be fixed to the housing. These contacts are usually fixed to the housing as by press-fitting.

Japanese Utility Model Application Opened No. H6-60,983 discloses one example of connectors of the "zero-insertion force" type. As can be seen from the "Abstract" of the Japanese Utility Model, this invention relates to a connector with a slider for a printed circuit board for use in a narrow space in an electronic or communication appliance. The slider is formed at ends of both sides with U-shaped arms with their proximal ends fixed to the slider as guiding means when being inserted into a housing. The U-shaped arms are each provided on its opening side with a projection and formed with a notch such that the opening end is visible from the inserting side. The housing is provided at both the ends with projections having an oblique surface adapted to engage the projections of the slider.

When the slider together with connection terminals of a flexible printed circuit board is inserted into the housing, the projections of the slider ride over the projections having the oblique surface of the housing so that the opening ends of the U-shaped arms of the slider are temporarily spread outwardly and then returned to their normal positions when the insertion has been completed.

Japanese Patent Application Opened No. H13-257,020 discloses one example of the so-called "piano touch" type connector. With a view to obtaining an accurate positioning of contacts of the disclosed connector relative to a flexible printed circuit board or its pattern, projections are provided in a row on a line on a terminal block between the contacts. After a flexible printed circuit board or flexible flat cable has been inserted into the terminal block, a slider is moved to urge the circuit board or flat cable against the contacts. At the moment when the circuit board or flat cable is electrically connected to the contacts by the slider in this manner, the projections snap into recesses between patterns of the circuit board or flat cable, thereby ensuring positional coincidence between the contacts and patterns of the circuit board or flat cable.

With miniaturization of electric or electronic appliances, recently, connectors for use in such appliances have been more strongly required to be more miniaturized to more flattened and thinner connectors with narrower pitches of contacts.

With the connectors disclosed in the Japanese Patent and Utility Model Applications, first the connector is fixed to a hard board as by reflow soldering and a flexible printed circuit board is then inserted into the connector to connect the flexible and hard boards. Such a connector comprises at least a housing and contacts fixed to the housing as by press-fitting as essential components. With such a connector, a technical problem remains that more miniaturization has been impossible such as narrower contact pitches, more space-saving and more flattened or thinner (less than 1 mm thickness). The miniaturization is limited by the workability and strength of insulating plastic materials forming housing of connectors and further limited by the fact that the housing is required to have the minimum required thickness for press-fitting contacts therein. Moreover, there may be a requirement of miniaturization as regards in longitudinal or traverse direction of a connector owing to other components and jigs for disassembling or the like.

Under such circumstances, with miniaturization of peripheral electric or electronic appliances, the connectors of the kinds mentioned in the above paragraphs have been strongly required to be more miniaturized. For this purpose, the applicant has proposed a connector in Japanese Patent Application No. 29,198/2003.

With the connector disclosed in the above Japanese Patent Application No. 29,198/2003, in order to automatically mount a mounting member onto a hard board by a suction mounter, the mounting member is first temporarily secured to the hard board by adhesive tapes and then set in position on the hard board by the suction mounter, because the mounting member does not have a portion to be sucked by a suction mounter. Therefore, this process involves additional steps and management for installing, removing and discarding the tapes, resulting in high cost manufacture and potential environment deterioration. When the mounting member is sucked by the suction mounter, there would be a risk for the thin mounting member being deformed, if the suction is too strong.

SUMMARY OF THE INVENTION

It is an object of the invention, in view of the problems of the prior art, to provide a connector which fulfils the requirements with respect to more miniaturization, more flatness, more thinner and narrower pitches of contacts, and a mounting member which can be easily mounted on a hard board and a method for mounting the mounting member onto the hard board.

In order to accomplish the object for achieving more miniaturization, more flatness, more thinner and narrower pitches of a connector, in the connector for connecting a flexible printed circuit board and a hard board according to the invention, the flexible printed circuit board comprises contact portions, each contact portion comprising a bump contact thereon, and the flexible printed circuit board is formed with slits between the bump contacts, or between pairs of bump contacts, each pair consisting of two adjacent bump contacts, or between the bump contacts arbitrarily selected to provide a compliance to these bump contacts. The connector according to the invention, moreover, comprises a mounting member arranged on the hard board, bump contacts on contact portions of the flexible printed circuit board, an elastic member on the surface of the flexible printed circuit board on the opposite side of the bump contacts, and a pusher member for urging the flexible printed circuit board and the elastic member toward the hard board, thereby engaging the pusher member with the mounting member to cause the flexible printed circuit board to connect to the hard board.

The connector according to the invention comprises a mounting member arranged on the hard board, bump contacts on contact portions of the flexible printed circuit board, an elastic member on the surface of the flexible printed circuit board on the opposite side of the bump contacts, and a pusher member for urging the flexible printed circuit board and the elastic member toward the hard board, thereby engaging the pusher member with the mounting member to cause the flexible printed circuit board to connect to the hard board. With this construction, more miniaturization, more flatness and narrower pitches of the connector can be accomplished.

In the connector according to the invention, two tab portions of the mounting member to be connected to the hard board are made substantially in the same shape as that of land areas of the hard board within a range to be affected by surface tension of molten solder so that the mounting member is positioned in place on the hard board with the aid of self-alignment effect. In this manner, the mounting member can be arranged in place on the hard board with the aid of the self-alignment effect caused by the surface tension of molten solder.

According to the invention, the mounting member includes the two tab portions integrally connected. By connecting the two tab portions, the positioning of the mounting member relative to the hard board can be readily carried out because members to be positioned become only one member.

According to the invention, the hard board is provided with a plurality of circular lands and the mounting member is provided with exposed connecting portions having a shape the same as that of the lands at locations corresponding to the circular lands on the hard board. By providing the circular lands, the surface tension becomes likely to occur to enhance the self-alignment effect.

In the connector according to the invention, the flexible printed circuit board and the elastic member are fixed to each other so that when the pusher member is engaged with the mounting member, the pusher member is accurately held in a desired position relative to the mounting member. By fixing together these members, setting of these members in place can easily be performed.

According to the invention, a pushing portion of the pusher member consists of two members adhered together. The pusher member becomes stronger in this manner.

The two members of the pusher member are made of the same material and different in thickness or shape, or the two members are made of different materials and different in thickness or shape. Moreover, one of the two members of the pusher member on the side of the elastic member has a curved shape such that the urging force is uniformly distributed.

According to the invention, the pusher member is provided with anchor portions bent in the form of a U-shape at locations corresponding to engaging portions of the mounting member. This construction will contribute to the flatness and miniaturization in the width direction of the connector.

The mounting member according to the invention comprises a plurality of mounting portions each including a tab portion to be fixed to a hard board and an engaging portion to engage a mating member, and the plurality of mounting portions being integrally connected by a connecting member provided with at least one protrusion plate connected thereto. As a result, automatic mounting becomes possible, resulting in low cost manufacture.

The method for mounting a mounting member onto a hard board by soldering according to the invention comprises steps of sucking a protrusion plate of the mounting member, arranging the mounting member in place on the hard board, fixing the mounting member to the hard board by reflow soldering, and removing the protrusion plate from the mounting member. According to the method, the mounting member can be easily fixed to the hard board without increasing manufacturing cost and without causing environment deterioration.

Preferably, tab portions of the mounting member are made substantially in the same shape as that of land areas on the hard board, and the mounting member is arranged within a range to be affected by surface tension of molten solder to provide self-alignment effect in reflow soldering. In this manner, the mounting member can be arranged in place on the hard board with the aid of the self-alignment effect owing to the surface tension of the molten solder.

According to the invention, the protrusion plate is formed so as to provide at least one clearance between the hard board and the protrusion plate at any portion of it. Moreover, a connecting portion between the protrusion plate and the connecting member is formed with at least one notch. The protrusion plate is removed from the mounting member after the mounting member has been arranged and fixed in place on the hard board by reflow soldering.

According to the invention, the flexible printed circuit board is formed with slits between the bump contacts, or between pairs of bump contacts, each pair consisting of two adjacent bump contacts, or between the bump contacts arbitrarily selected so as to permit individual bump contacts to be independent of one another to provide compliance to the bump contacts sufficient to accommodate differences in height of these bump contacts, thereby obtaining stable connection between the flexible and hard boards.

According to the invention, two tab portions of the mounting member to be connected to the hard board are formed substantially in the same shape as that of land areas of the hard board within a range to be affected by surface tension of molten solder so that the tab portions tend to go into desired positions with the aid of self-alignment effect owing to the surface tension of molten solder, when the mounting member is mounted onto the hard board.

As can be seen from the above descriptions, the connector, the mounting member and the method for mounting the mounting member onto a hard board according to the invention can bring about the following significant functions and effects.

(1) In a connector for connecting a flexible printed circuit board to a hard board, according to the invention, bump contacts are provided on contact portions of the flexible printed circuit board, and the flexible printed circuit board is formed with slits between two bump contacts, or between pairs of bump contacts, each pair consisting of two adjacent bump contacts, or between bump contacts arbitrarily selected so as to permit individual bump contacts to be independent of one another to provide compliance to the bump contacts sufficient to accommodate differences in height of the bump contacts. Therefore, the stable connection is obtained between the flexible and hard boards.

(2) According to the invention, a mounting member is arranged on the hard board, and the flexible printed circuit board is provided on the contact portions with bump portions and on the opposite side with an elastic member. A pusher member for urging the flexible printed circuit board and the elastic member is provided, and by engaging the pusher member with the mounting member, the connection of the flexible and hard boards is achieved. It becomes possible to obtain a connector with narrower pitches of contacts, occupying least space and flattened to less than 1 mm in thickness.

(3) As the flexible printed circuit board is directly forced against the hard board according to the invention, a connector flattened as much as possible can be obtained.

(4) According to the invention, two tab portions of the mounting member to be connected to the hard board is formed substantially in the same shape as that of land areas on the hard board within a range to be affected by surface tension of molten solder, thereby positioning the mounting member on the hard board with the aid of the self-alignment effect. Therefore, the mounting member can be easily arranged on the hard board with the aid of the self-alignment effect owing to the surface tension of the molten solder.

(5) According to the invention, the mounting member consists of the two tab portions integrally connected by a connecting member to form a unitary body. Therefore, the number of parts is decreased, and the positioning of the mounting member as one unitary body can be performed with less errors than two tab portions are positioning separately, so that the positioning of the mounting member on the hard board can be carried out more exactly.

(6) According to the invention, the hard board is provided with a plurality of circular lands and the mounting member is provided with exposed connecting portions having the same shape as that of the lands at location corresponding to the lands. Accordingly, the surface tension of molten solder is more easily produced to increase the self-alignment effect so that the mounting member can readily be fixed to the hard board by reflow soldering.

(7) According to the invention, the flexible printed circuit board and the elastic member are integrally fixed to each other such that the pusher member can be accurately held in a desired position relative to the mounting member when the pusher member is engaged with the mounting member. Therefore, such an integrally connected unit can be easily brought into a desired position to ensure the connection of the bump contacts of the flexible printed circuit board and pads of the hard board.

(8) According to the invention, the pushing portion of the pusher member consists of two members adhered together. Accordingly, the pusher member becomes stronger.

(9) According to the invention, the two members of the pusher member are made of the same material and different in thickness or shape, or the two members are made of different materials and also different in thickness or shape. With these constructions, the pusher member becomes stronger to ensure the reliable connection of the flexible printed circuit board to the hard board.

(10) According to the invention, one of the two members of the pusher member on the side of the elastic member is curved so that the force urging the pusher member to the mounting member is uniformly distributed. Therefore, uniform contact pressure can be obtained to ensure stable contact between the bump contacts of the flexible printed circuit board and the pads of the hard board.

(11) According to the invention, the pusher member is provided with the anchor portions bent into a U-shape at locations corresponding to the engaging portions of the mounting member. This construction will help to flatten the connector and miniaturize it in its width direction.

(12) According to the invention, the mounting member is provided with a plurality of mounting portions each having a tab portion and an engaging portion, and the plurality of mounting portions are integrally connected by a connecting member provided with at least one protrusion plate. With this construction, automatic mounting becomes possible without increasing production steps and management for installing, removing and discarding tapes and without increasing manufacturing cost and without causing potential environment deterioration.

(13) According to the method of the invention for mounting the mounting member on the hard board by soldering, the protrusion plate of the mounting member is sucked and the mounting member is arranged in position on the hard board, and thereafter the mounting member is fixed in desired position to the hard board by reflow soldering after that the protrusion plate is removed therefrom. According to this method, the automatic mounting becomes possible and the mounting member can be easily fixed to the hard board without increasing production steps and management for installing, removing and discarding tapes, without increasing manufacturing cost and without causing potential environment deterioration.

(14) According to the invention, the mounting member can be readily fixed to the hard board, resulting in that flattening of the connector is possible and manufacturing cost is reduced.

(15) According to the invention, the protrusion plate of the mounting member is formed so as to provide at least one clearance between the hard board and the protrusion plate at any portion of it, and the connecting portion between the protrusion plate and the connecting member is formed with at least one notch. Therefore, the protrusion plate can be easily removed from the mounting member after it has been fixed to the hard board by reflow soldering.

The invention will be more fully understood by referring to the following detailed specification and claims taken in connection with the appended drawings.

DESCRIPTION OF THE PREFERRED EMBODIMENTS

Figure 1:
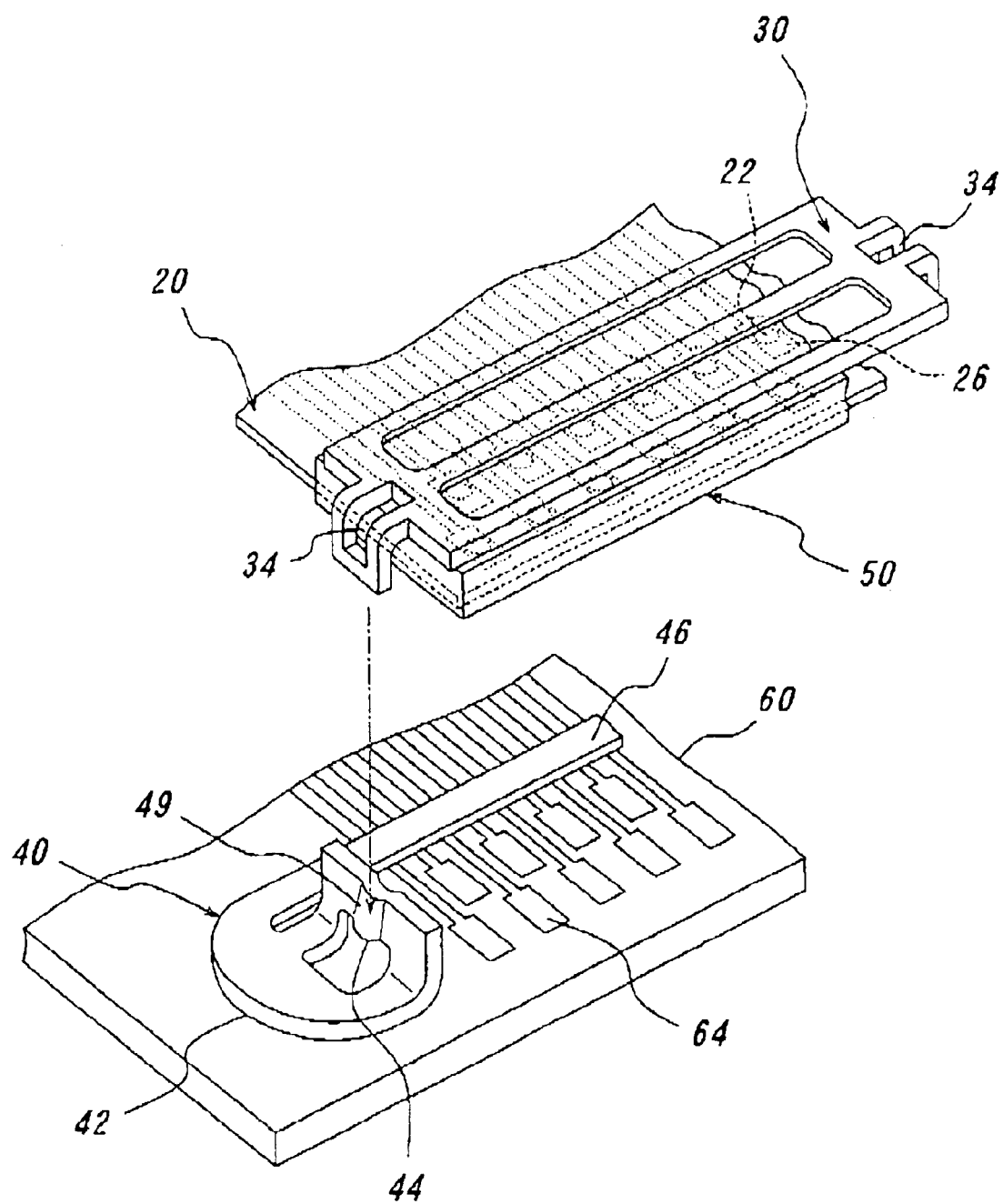
FIG. 1 is a perspective view illustrating a pusher member, an elastic member and a flexible printed circuit board fixed to one another and a mounting member fixed to a hard board.
Figure 2:
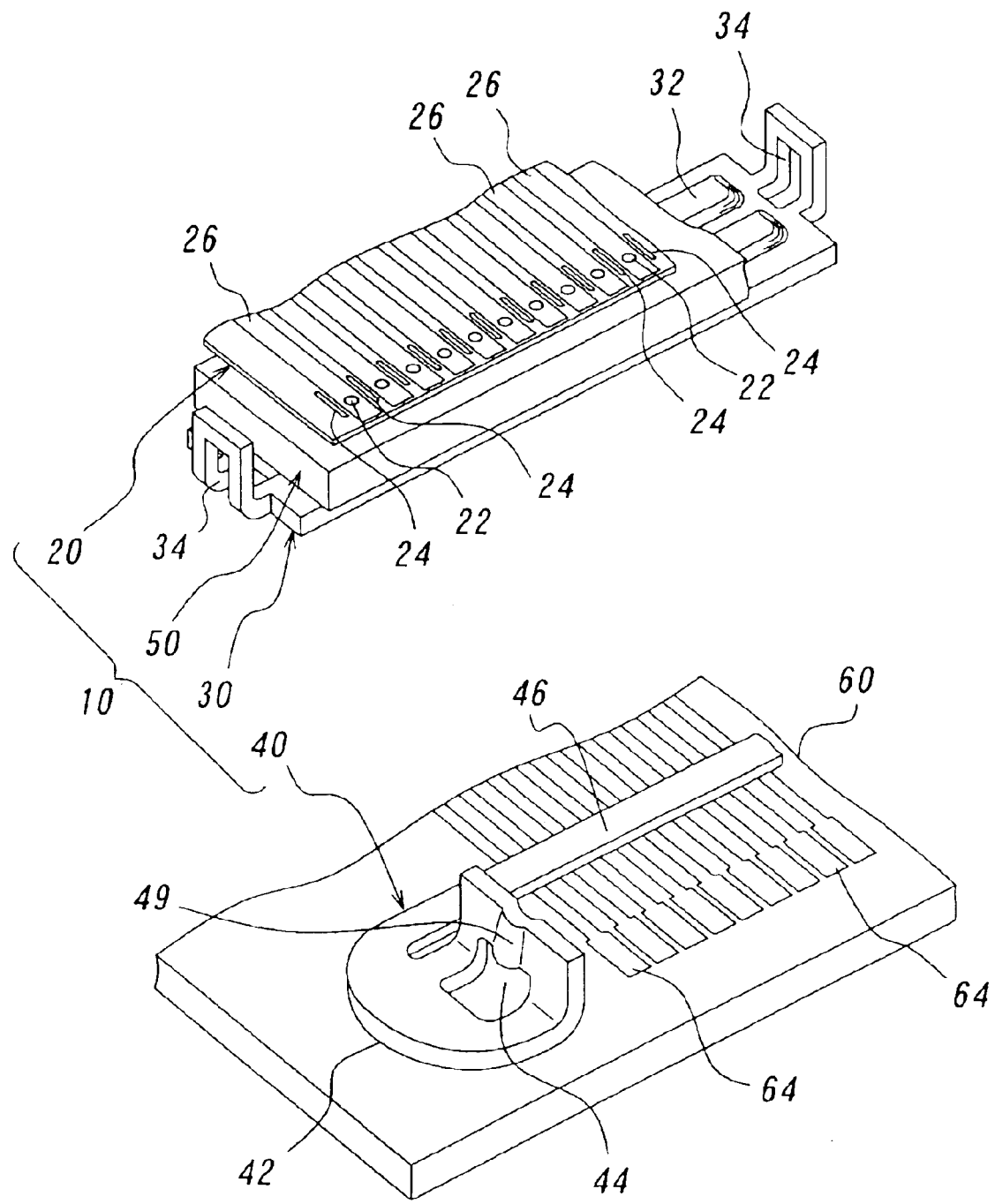
FIG. 2 is a perspective view similar to FIG. 1, but the flexible printed circuit board provided with slits between bump contacts.
Figure 3:
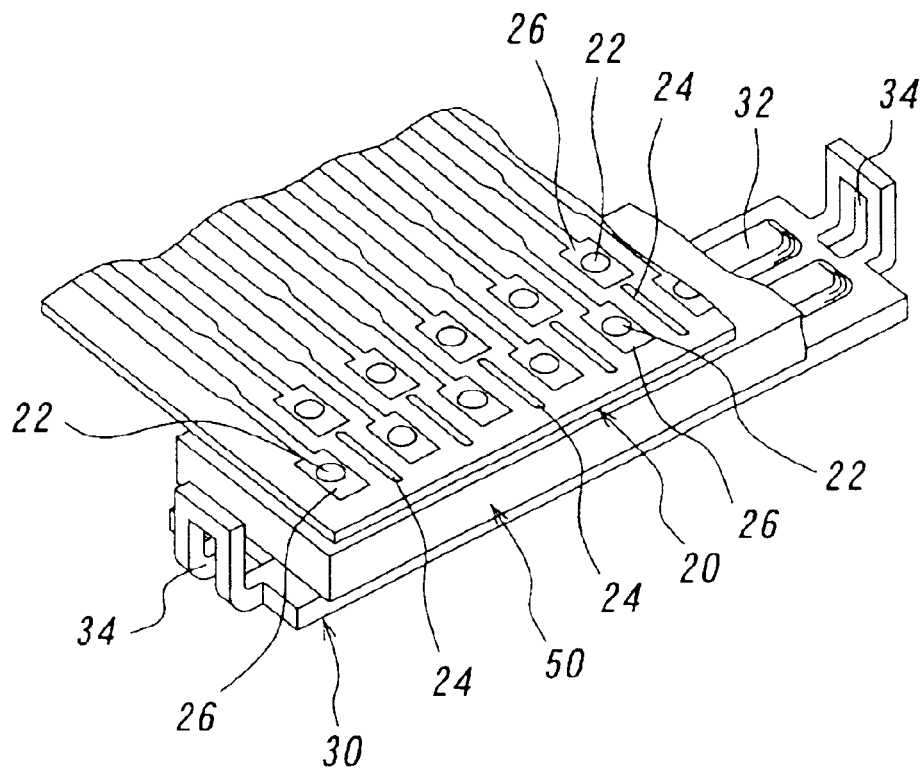
FIG. 3 is a perspective view illustrating a flexible printed circuit board similar to that in FIG. 1 but formed with slits between bump contacts.
Figure 4:
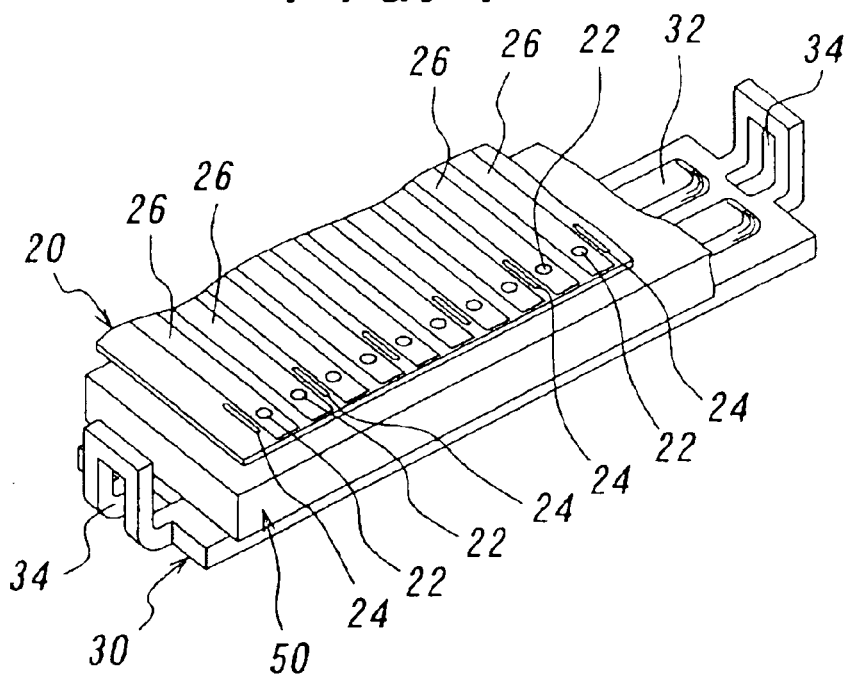
FIG. 4 is a perspective view illustrating a flexible printed circuit board similar to that in FIG. 2 but formed with slits between pairs of bump contacts.

A connector according to the invention will be explained hereinafter. First, a flexible printed circuit board and a hard board and connection construction thereof will be explained. As shown in FIG. 1, the flexible printed circuit board 20 is provided with bump contacts 22 on respective contact portions 26 thereon. The flexible printed circuit board 20 is formed with slits 24 between bump contacts 22 as shown in FIG. 2, or between pairs of bump contacts 22, each pair consisting of two adjacent bump contacts 22 as shown in FIGS. 3 and 4. The slits 24 make the bump contacts 22 between the slits 24 independent of the circuit board to obtain somewhat freedom of movement, thereby allowing slight deviation in height of the bump contacts 22. In other words, complete contact of the bump portions 22 with mating contacts can be assured owing to the resulting compliance even if there are some deviations in height of the bump contacts 22.

The shape and size of the slits 24 may be designed in consideration of the above functions. Although not shown, the slits 24 may be provided only between arbitrarily selected bump contacts 22. So long as the required compliance can be obtained, slits 24 may be formed in any locations, for example, in every fourth space between bump contacts, or in every other space, every third space, every other space, every third space, and so forth.

Figure 6:
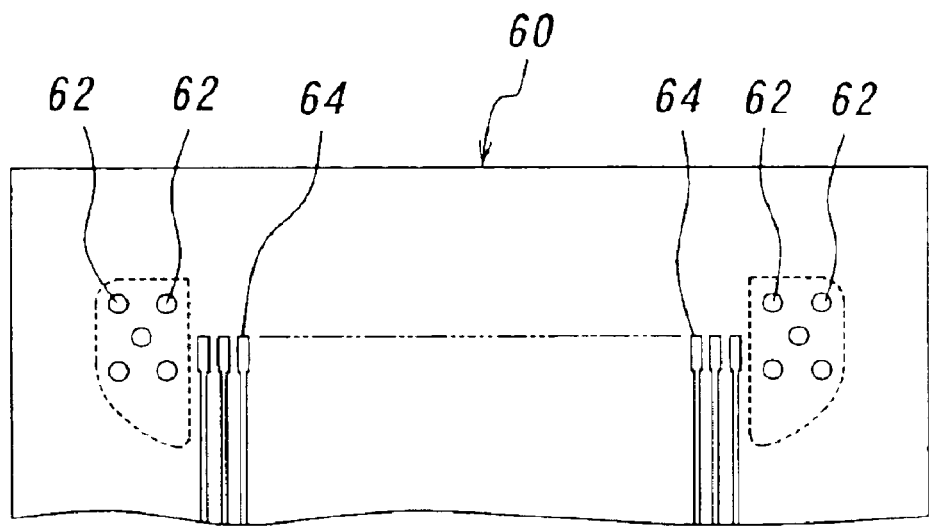
FIG. 6 is a plan view illustrating the hard board and the mounting member viewed from the surfaces to be fixed to each other.
Figure 6:
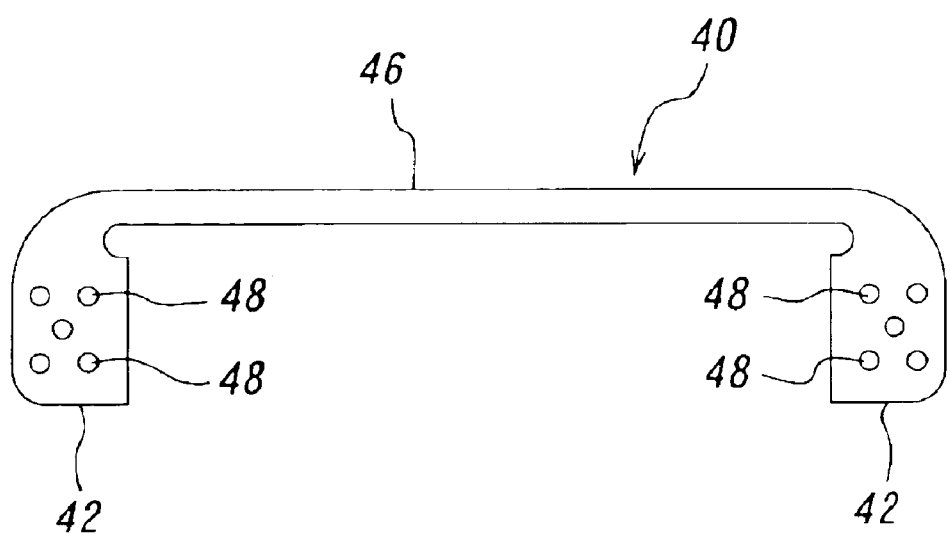

A hard board 60 is provided with pads 64 in desired positions according to customer's specification or the like as shown in FIGS. 1, 2 and 6. Also provided on the hard board 60 are lands 62 for fixing a mounting member 40 discussed below. With the connector 10 according to the invention, the bump contacts 22 of the flexible printed circuit board 20 are adapted to be connected to the pads 64 of the hard board 60.

The connector 10 of the illustrated embodiment mainly comprises the flexible printed circuit board 20, an elastic member 50, the mounting member 40 and a pusher member 30. The connector 10 according to the invention is particularly intended to be thinned and space-saving connector. The connector 10 is adapted to be connected to the hard board. The respective components of the connector 10 will be explained hereinafter.

Figure 5:
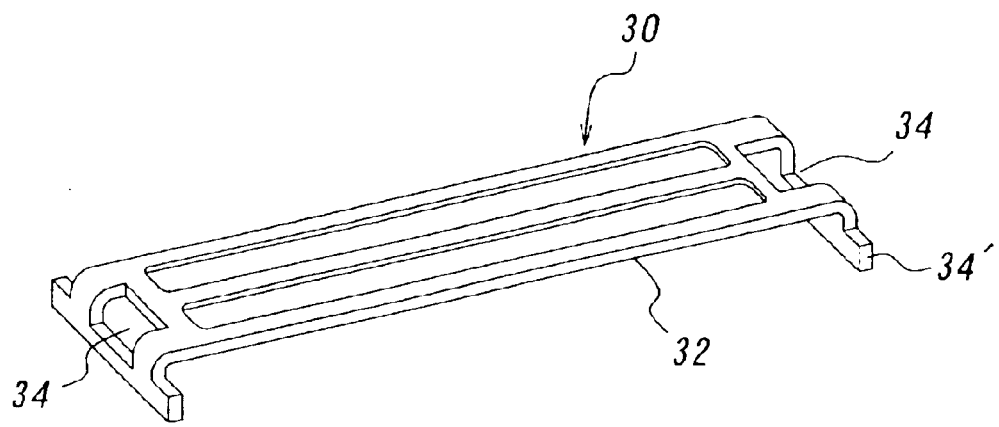
FIG. 5 is a perspective view illustrating another pusher member and another mounting member fixed to a hard board.
Figure 5:
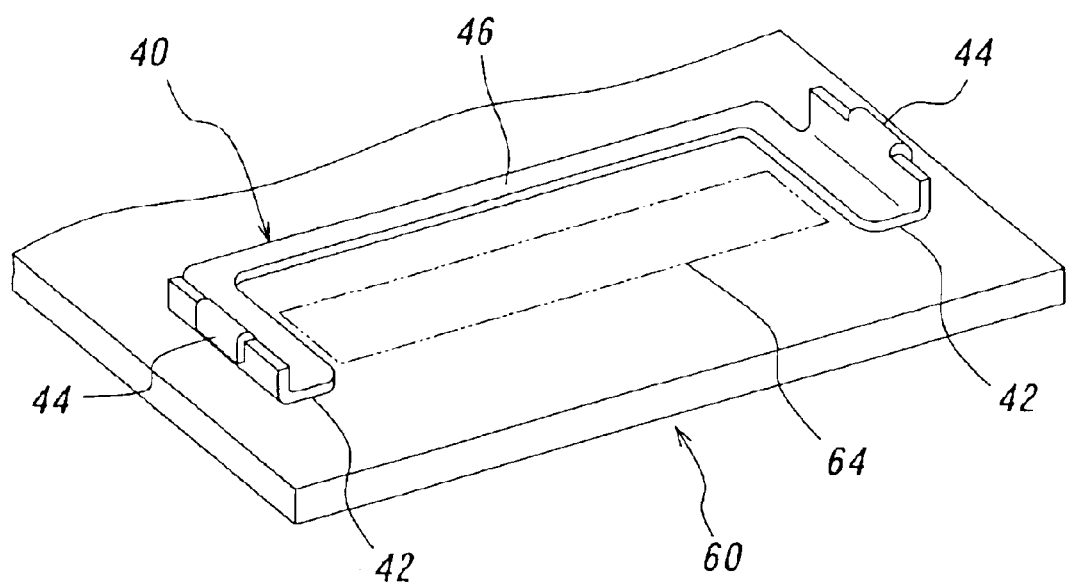

The mounting member 40 is substantially U-shaped as clearly shown in FIG. 5 and formed by known press-working from a metal. Metals for the mounting member 40 include brass, beryllium copper, phosphor bronze and the like to fulfil the requirements imposed thereon, springiness, workability, dimensional stability and the like.

The mounting member 40 is provided with two tab portions 42 at locations corresponding to the lands 62 of the hard board 60. The shape of the tab portions 42 is substantially the same as that of the land areas surrounding by broken lines (FIG. 6) within a range to be affected by surface tension of molten solder so that when the mounting member is mounted on the hard board 60 by reflow soldering, the former can readily be arranged in place to the latter with the aid of a self-alignment effect owing to the surface tension of the molten solder. In other words, the shape of the tab portions 42 is suitably designed so as to generate such a self-alignment effect by the molten solder. The fixation of the mounting member 40 in place to the hard board 60 ensures that the bump contacts 22 of the flexible printed circuit board 20 are securely connected to the pads 64 of the hard board 60 when the pusher member 30 is brought into engagement with the mounting member 40.

The two tab portions 42 are connected by a connecting member 46 to each other to form a unitary construction. The shape and size of the connecting member 46 may be suitably determined in consideration of miniaturization and flatness of the connector and strength of the connecting member 46.

Moreover, the tab portions 42 are provided with engaging portions 44 adapted to engage the pusher member 30, respectively. Any size and shape of the engaging portions 44 may be employed so long as they can engage the pusher member 30 and may be determined in view of the miniaturization and flatness of the connector. In the illustrated embodiment, parts of the tab portions 42 are bent substantially vertically and the bent portions are provided with protrusions 49 adapted to engage the pusher member 30 as shown in FIG. 1. The bent portions are preferably as small as possible to fulfil the requirement for connector to be flattened so long as they can engage the pusher member 30.

A method for enhancing the self-alignment effect described above will be explained by referring to FIG. 6 herein. As shown in FIG. 6, the hard board 60 is provided with five circular lands 62 in each of the land area surrounded by broken lines, while the mounting member 40 is provided with connection portions 48 at locations corresponding to the lands 62 of the hard board 60. In providing the connection portions 48, masking may be used, that is, the tab portions are covered by masks except for portions to be provided with the connection portions 48. In this manner, the plurality of the circular lands 62 and the circular connection portions 48 will provide increased portions in which the surface tension of molten solder is exerted, with resulting increased self-alignment effect.

The flexible printed circuit board 20 will be explained. As described above, the circuit board 20 is provided with a required number of contact portions 26 positioned corresponding to the pads 64 on the hard board 60, and the contact portions 26 are each provided thereon with a bump contact 22 adapted to contact with each pad 64 of the hard board 60. As mentioned above, the slits 24 will give a compliance to the bump contacts 22 so as to accommodate deviations in height of the bump contacts 22. Whether the slits are provided or not may be suitably determined depending upon spacing between adjacent terminals. In other words, the narrower the spacing is, the more preferable the slits are provided.

The elastic member 50 will then be explained. The elastic member 50 is provided to prevent the flexible printed circuit board 20 from being damaged when the bump contacts 22 on the flexible printed circuit board 20 are urged against the pads 64 of the hard board 60. Materials for the elastic member 50 include silicone rubber, neoprene rubber and the like. The size of the plastic body 50 may be suitably determined in consideration of its function described above and miniaturization and flatness of the connector. Sufficient is the size capable of covering the contact portions 26 of the flexible printed circuit board 20. The thickness of the elastic member of the order of 0.3 to 0.5 mm may be enough to absorb the compression force of the pusher member.

The pusher member 30 will then be explained. The pusher member 30 is substantially plate-shaped and formed by the known press-working from a metal. Preferred materials from which to form the pusher member 30 include brass, beryllium copper, phosphor bronze and the like in view of springiness, workability, dimensional stability and the like required for the pusher member 30.

The pusher member 30 is provided with anchor portions 34 at locations corresponding to the engaging portions 44 of the tab portions 42 of the mounting member 40 to permit the anchor portions 34 to engage the engaging portions 44. Any size and shape of the anchor portions 34 may be employed so long as they can engage the mounting member 40. The anchor portions 34 may be suitably designed in consideration of miniaturization and flatness of the connector. In the illustrated embodiment, ends of the pusher member 30 are bent substantially perpendicular thereto to form bent portions on which the anchor portions 34 are provided. The size of the bent portions is preferably as small as possible within a range permitting the engagement with the engaging portion 44 of the mounting member 40 in consideration of miniaturization and flatness of the connector.

The pusher member 30 includes pushing portions 32 for pushing the elastic member 50 and hence the flexible printed circuit board 20. The pushing portions 32 are designed so as to be able to force the flexible printed circuit board 20 against the hard board 60 when the pusher member 30 engages the mounting member 40. Any size and shape of the pushing portions 32 may be employed so long as the flexible printed circuit board 20 can be urged against the hard board 60. The pushing portions 32 may be suitably designed in consideration of miniaturization and flatness of the connector and strength of the pusher member 30. In the illustrated embodiment, beading is applied to the surfaces of the pushing portions 32 in order to ensure the pushing action of the pusher member 30.

The pusher member 30 is preferably formed of two members in order to increase its strength in spite of the fact that the total thickness is thinner (FIG. 7). The two members may be of the same material or different materials. In the case of different materials, preferably, one is an elongation-resistant material and the other a bending-resistant material. In a beneficial example, one member has a thickness thicker than the other as shown in FIG. 7B or 7C. However, the maximum thickness should be limited to a value of the order of 0.3 mm in view of the flatness of the connector.

Figure 7A:
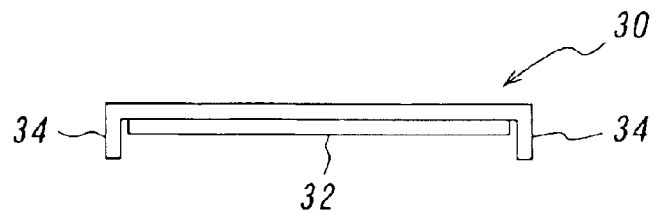
FIGS. 7A to 7E are explanatory views illustrating various pusher members each consisting of two members adhered together.
Figure 7B:
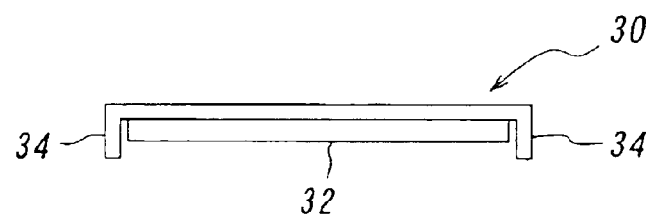
Figure 7C:
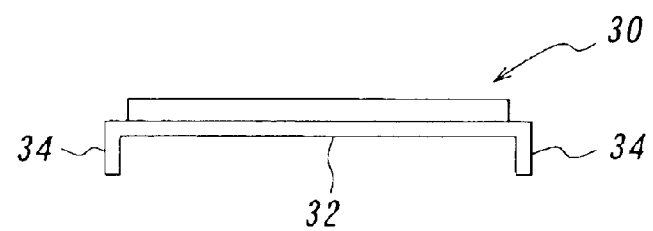
Figure 7D:
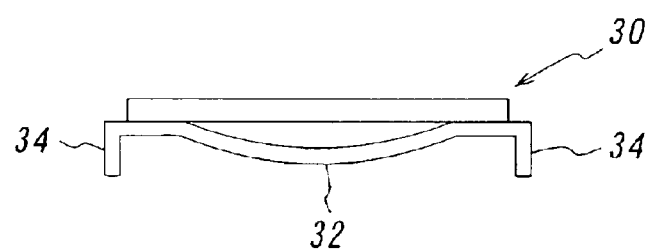
Figure 7E:
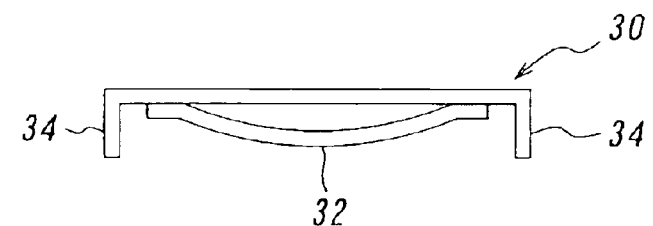

In the case that the pusher member 30 consists of two members, the member on the side of the elastic member 50 is preferably in the form of a curved shape as shown in FIGS. 7D and 7E, with a view to uniformly distributing the force pushing the elastic member 50. The degrees of curves are shown on an exaggerated scale in FIGS. 7D and 7E. In FIG. 7D, the anchor portions 34 are provided on the curved member, and in FIG. 7E, the anchor portions 34 are provided on the straight member.

FIG. 5 illustrates a pusher member 30 and an mounting member 40 of another embodiment, which are substantially similar in construction to those above described. In FIG. 5, parts of the mounting member 40 are bent to form engaging portions 44, while the pusher member 30 is formed with rectangular holes as anchor portions 34 correspondingly to the engaging portions 44 of the mounting member 40 so that the engaging portions 44 come into engagement with the rectangular holes 34 when the pusher member 30 is urged against the mounting member 40. The pusher member 30 including the anchor portions 34 is elastic so that the pusher member 30 can easily be removed from the engagement with the mounting member 40. In the same manner described above, fixed to the pusher member 30 are the elastic member 50 and the flexible printed circuit board 20.

Figure 8:
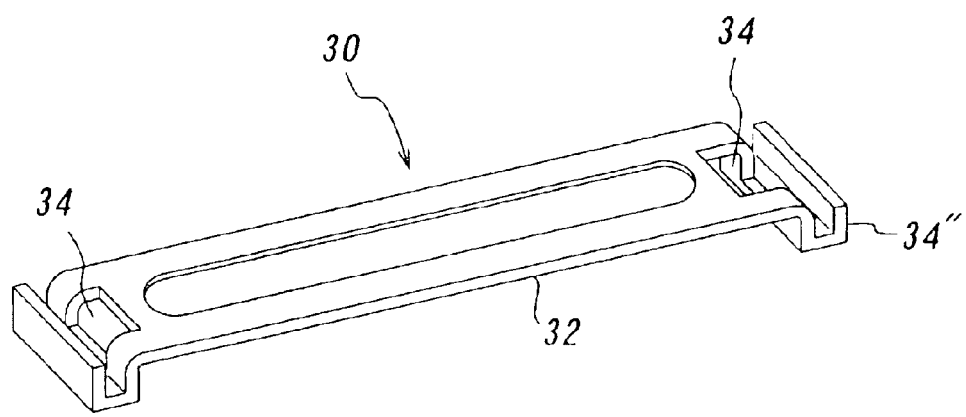
FIG. 8 is a perspective view illustrating a further pusher member and a further mounting member fixed to a hard board.
Figure 8:
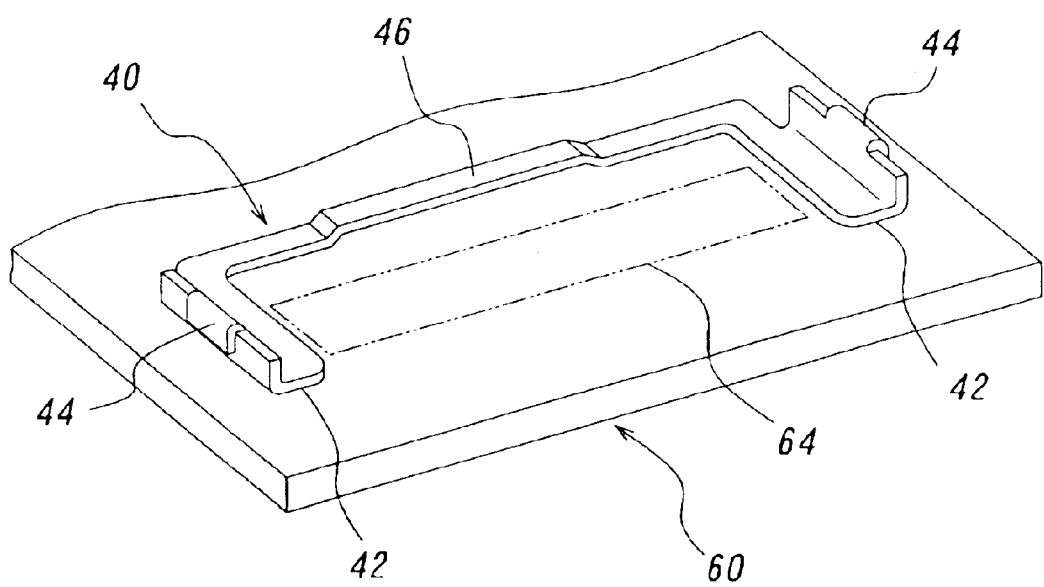

FIG. 8 illustrates a pusher member 30 and an mounting member 40 of a further embodiment which are substantially similar in construction to those shown in FIG. 5. In the same manner as that in FIG. 5, parts of the mounting member 40 are bent to form engaging portions 44, while the pusher member 30 is formed with rectangular holes as anchor portions 34 corresponding to the engaging portions 44 of the mounting member 40 so that the engaging portions 44 come into engagement with the rectangular holes 34 when the pusher member 30 is urged against the mounting member 40. The pusher member 30 in FIG. 5 is provided at both the ends with extension portions 34' extending in width directions, to which a tool is applied for removing the pusher member 30 from the mounting member 40. In FIG. 8, on the other hand, the pusher member 30 is provided at both the ends with U-shaped portions 34", to which the tool is applied for the removal of the pusher member 30. Other features of those shown in FIG. 8 is the same as the features of those in FIG. 5.

A method for assembling the connector 10 of the illustrated embodiment will be explained. First, the mounting member 40 is fixed in position onto the hard board 60 as by reflow soldering. Second, the pusher member 30, the elastic member 50 and the flexible printed circuit board 20 are, in that order, integrally fixed to one another to form an integral unit such that when the pusher member 30 is engaged with the mounting member 40, the pusher member 30 is accurately held in position relative to the mounting member 40, and the flexible printed circuit board is also accurately positioned relative to the hard board. Next, the thus assembled integral unit is directed with its flexible printed circuit board 20 toward the mounting member 40 fixed to the hard board 60 and the pusher member 30 is then brought into engagement with the mounting member 40, with the result that the bump contacts 20 of the flexible printed circuit board 20 come into contact with the pads 64 of the hard board 60, thereby achieving electrical continuity between the connector 10 and the hard board 60.

Figure 14:
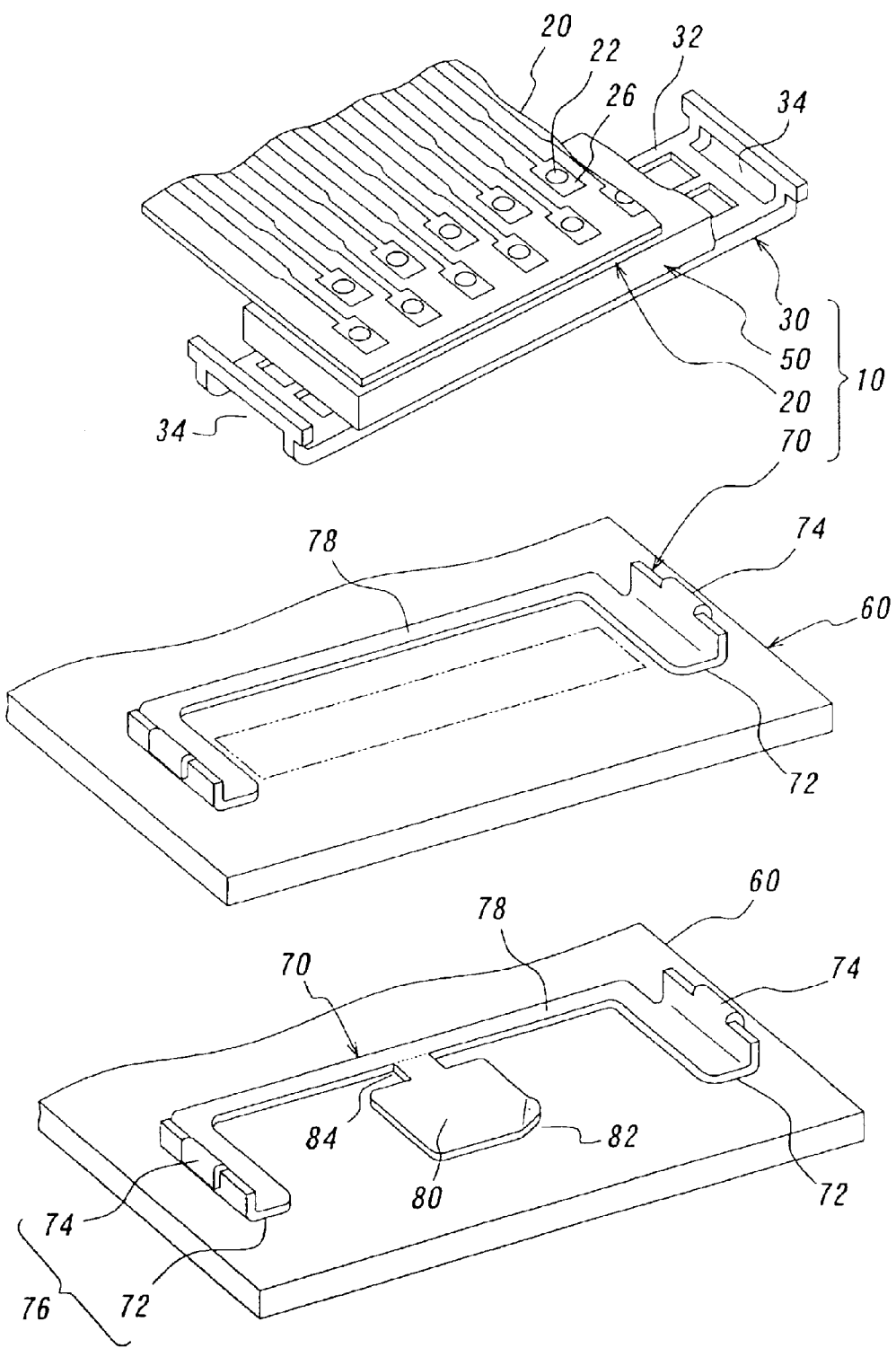
FIG. 14 is a perspective view of a pusher member, an elastic member and a flexible printed circuit board not having slits fixed to one another and a mounting member fixed to a hard board before and after removal of the protrusion plate.

While the flexible printed circuit board formed with slits 24 for providing the compliance is explained in the above embodiment, it will be apparent that a flexible printed circuit board not having slits of course can also be used for the connector according to the invention. In the case particularly that the bump contacts are arranged with a large pitch or in a single row, the slits may not be provided. An example of a flexible printed circuit board not having slits is shown in FIGS. 1 and 14.

Another aspect of the invention will be explained by referring to FIGS. 9 to 14 hereinafter. This aspect relates to a mounting member and a method for mounting the mounting member on a hard board. The connectors illustrated in FIGS. 9 to 14 are substantially similar construction to those in FIG. 1–8, and therefore the same features of the components of the connectors to those in FIGS. 1–8 will not be described in further detail.

Figure 9:
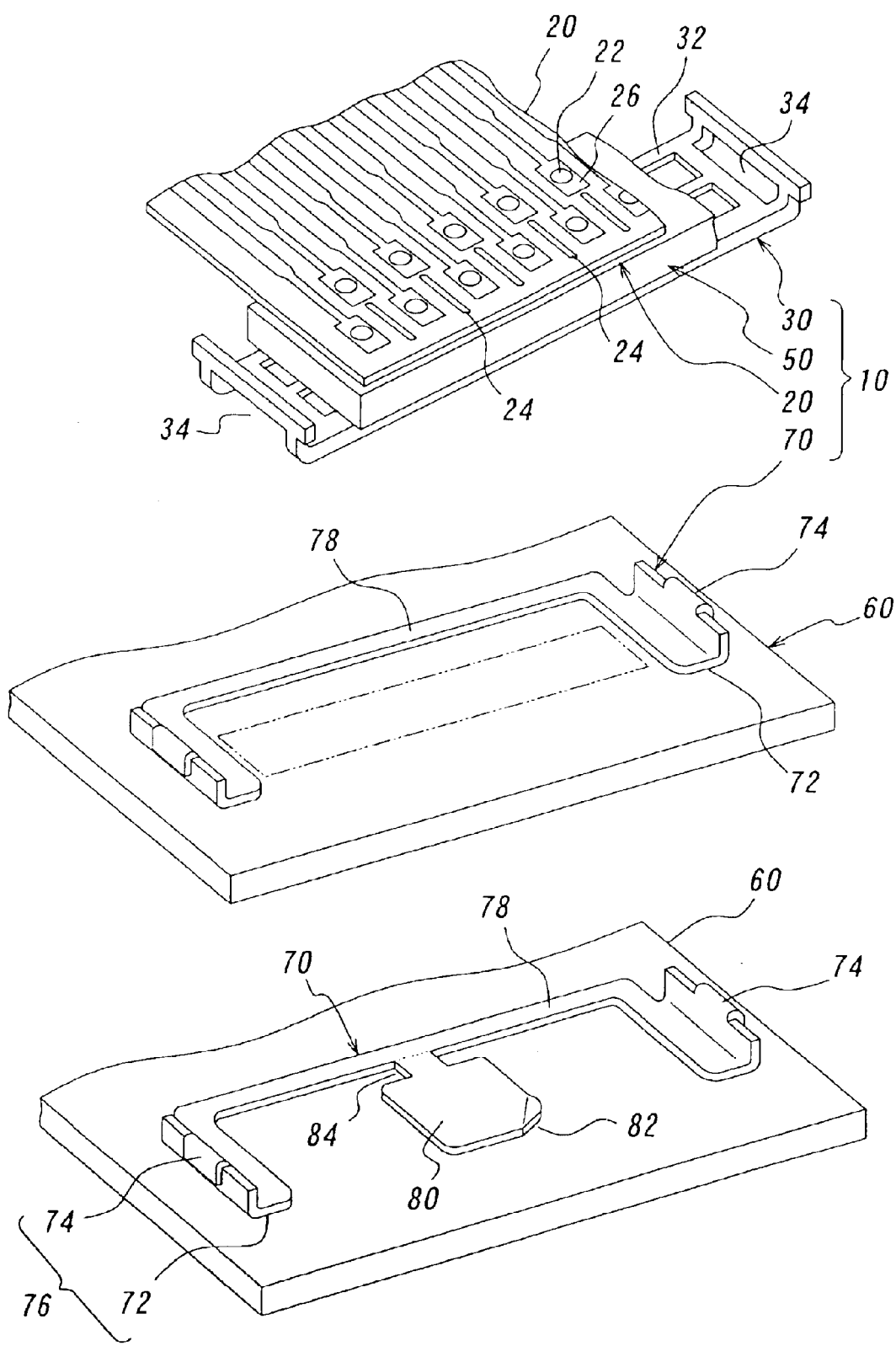
FIG. 9 is a perspective view of a pusher member, an elastic member and a flexible printed circuit board fixed to one another, and a mounting member fixed to a hard board before and after removal of the protrusion plate.
Figure 10:
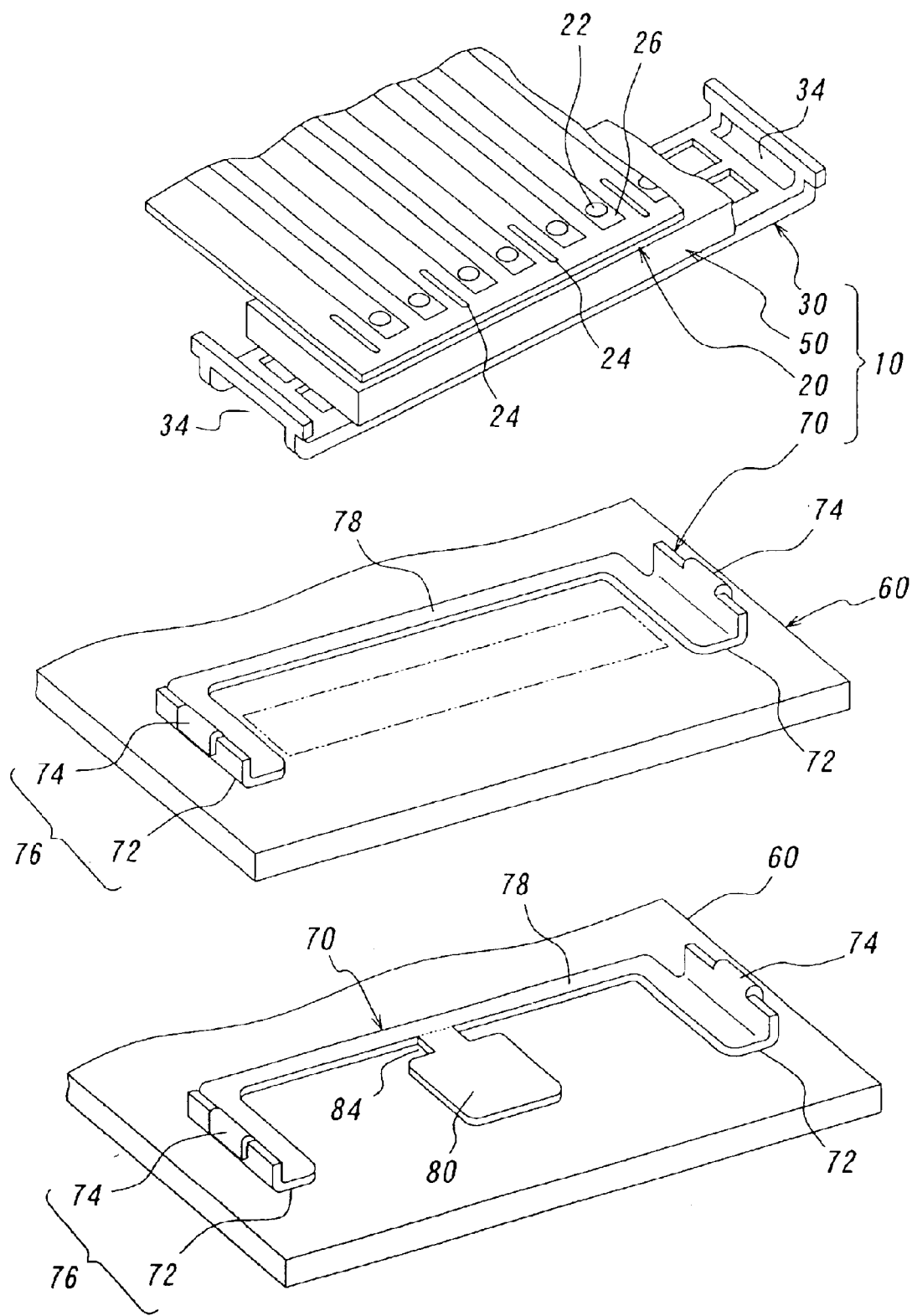
FIG. 10 is a perspective view similar to FIG. 9 but illustrating different members.
Figure 11:
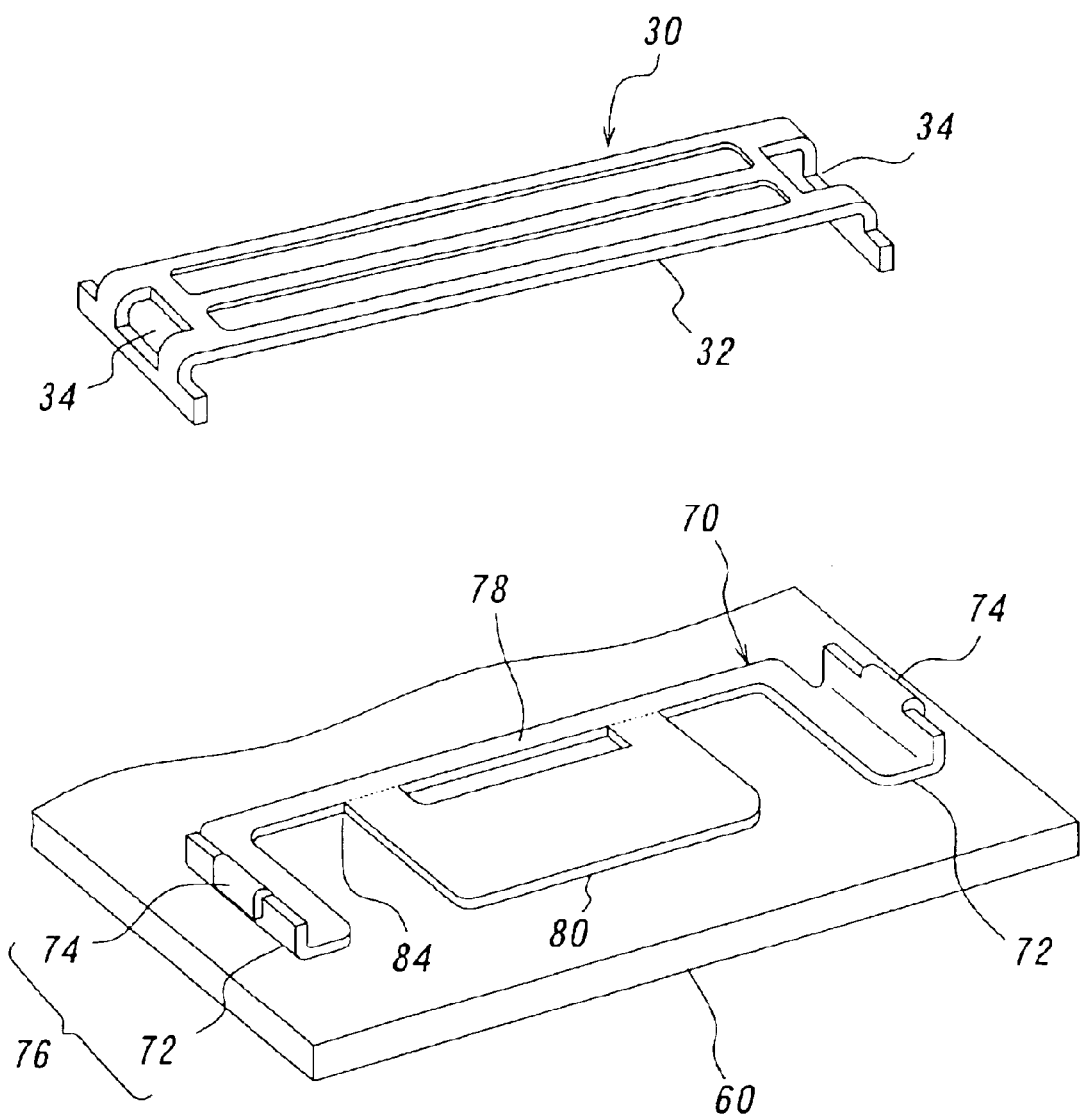
FIG. 11 is a perspective view illustrating a mounting member having a protrusion plate fixed to a hard board and a pusher member.
Figure 12:
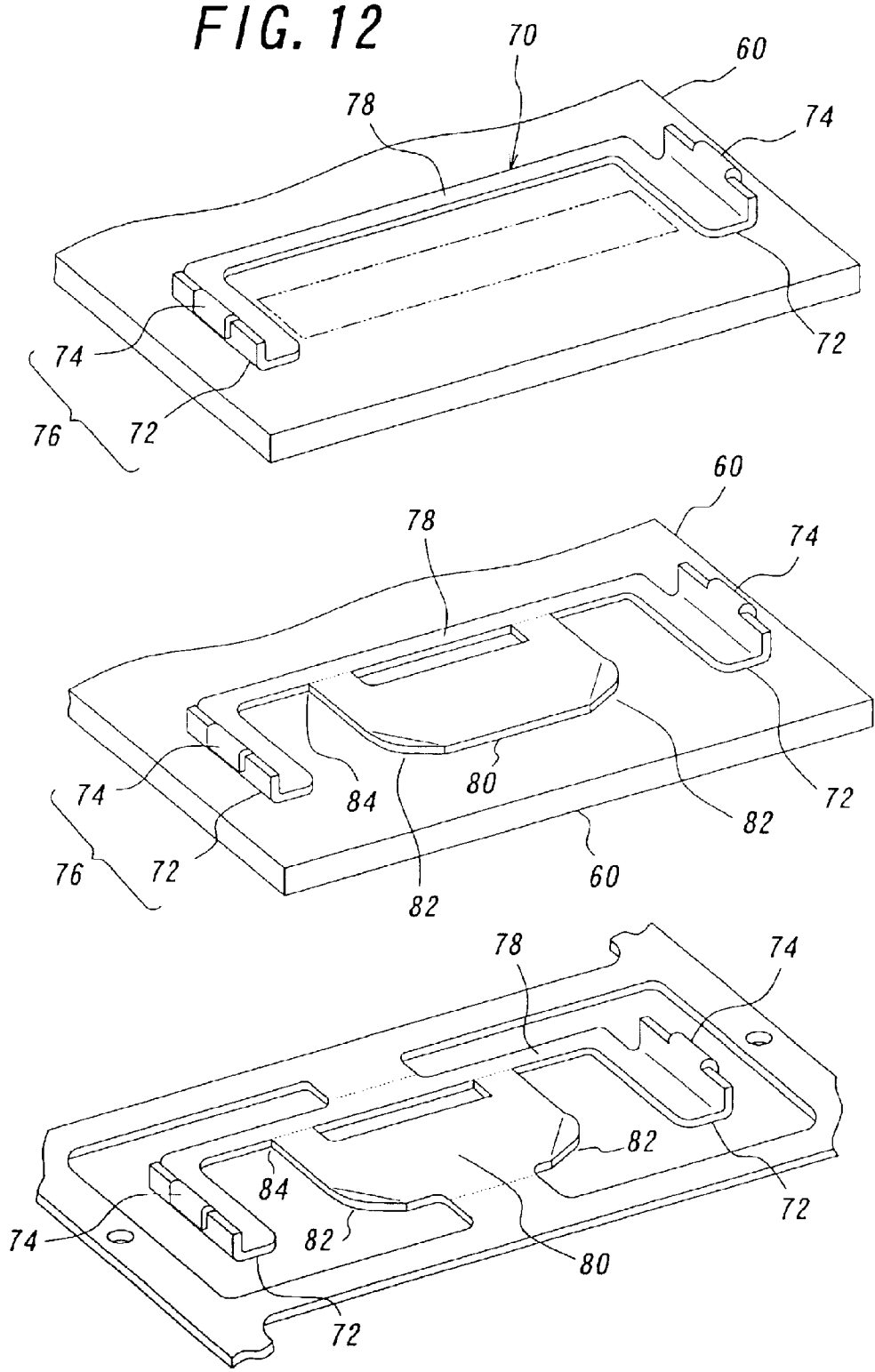
FIG. 12 is a perspective view for explaining a state of fixing a mounting member to a hard board.

Referring to FIG. 9, the connector 10 mainly comprises a flexible printed circuit board 20 having contact portions 26 and bump contacts 22 thereon, an elastic member 50, a pusher member 30 and a mounting member 70. The mounting member 70 is mounted on a hard board 60, and the pusher member 30 having the flexible printed circuit board 20 and the elastic member 50 fixed to the pusher member 30 is brought into engagement with the mounting member 70 mounted on the hard board 60 so that the bump contacts 22 are urged against pads (not shown) on the hard board 60, thereby achieving electrical continuity of the connector 10 in the same manner as in the connector 10 shown in FIG. 1.

The flexible printed circuit board 20, the elastic member 50 and the pusher member 30 are substantially same as those in FIGS. 1–8 and therefore explanations as to these members will not be described.

The mounting member 70 will be explained in detail. The mounting member 70 is ultimately substantially in the form of U-shape, which is adapted to engage the pusher member 30 in the same manner as in the embodiments in FIGS. 1–8. The material and forming method for the mounting member 70 are substantially the same as those in FIGS. 1–8.

The mounting member 70 is provided with a plurality of mounting portions 76 each having a tab portion 72 at a location corresponding to the lands 62 (FIG. 6) and an engaging portions 74 adapted to engage the pusher member 30. The shape of the tab portions 72 is substantially the same as that of the land areas within a range to be affected by surface tension of molten solder, so that when the mounting member is mounted on the hard board 60, the former can readily be position in place on the latter with the aid of a self-alignment effect owing to the surface tension of the molten solder. In other words, the shape of the tab portions 72 is suitably designed so as to generate such a self-alignment effect by the molten solder. The fixation of the mounting member 70 in place to the hard board 60 ensures that the bump contacts 22 of the flexible printed circuit board 20 are certainly connected to pads 64 of the hard board 60 when the pusher member 30 is brought into engagement with the mounting member 70.

In order to enhance the self-alignment effect described above, the hard board 60 is provided with five circular lands 62 in each of the land areas shown in broken lines in FIG. 6, while the mounting member 70 is provided with connection portions 48 (FIG. 6) at locations corresponding to the lands 62 of the hard board 60. In this manner, the plurality of the circular lands and the circular connection portions will provide increased portion in which the surface tension of molten solder acts, with resulting increased self-alignment effect.

The plurality of the mounting portions 76 are connected by an connecting member 78 to form an integral unit. FIGS. 9 to 12 illustrate the mounting members 70 each having two mounting portions 76. The shape and size of the connecting member 78 are suitably designed in consideration of the miniaturization and flatness of the connector and strength of the connecting member 78.

As described above, each of the mounting portions 76 includes the engaging portion 74. Any size and shape of the engaging portions 74 may be employed so long as they can engage the pusher member 30 and they may be designed in view of the miniaturization and flatness of the connector. In the embodiments illustrated in FIGS. 9 to 13, part of each of the tab portions 72 is bent substantially vertically to form a vertical portion, and a small part of the vertical portion corresponding to the engaging portion 34 of the pusher member 30 is bent back to form an anchor portion 74. The sizes of the vertical portions and the anchor portions 74 are preferably as small as possible to fulfil the requirement for the connector to be flattened so long as they can engage the pusher member 30.

The connecting member 78 includes a protrusion plate 80 which is adapted to attach to the hard board 60 by suction caused by a suction mounter for automatically mounting the mounting member 70 on the hard board 60. The shape and size of the protrusion plate 80 are suitably designed in consideration of capability to be sucked and attached to the hard board by the suction mounter, not being deformed when being sucked, and miniaturization and flatness of the connector. Preferably, the protrusion plate 80 has a thickness substantially equal to that of the mounting member 70 in view of easiness in working.

The protrusion plate 80 is removed after the mounting member 70 has been fixed to the hard board 60 by reflow soldering. In order to remove it from the mounting member 70 easily, the protrusion plate 80 is provided with at least one raised portion to provide a clearance 82 between the raised portion and the hard board 60. In the illustrated embodiment, one corner of the protrusion plate 80 is slightly bent away from the hard board 60 to form a right angled triangular raised portion as shown in FIG. 9. Moreover, the protrusion plate 80 is formed with notches 84 in its one side merging with the connecting member 78. With this configuration, after the mounting member 70 has been fixed to the hard board 60 by reflow soldering, a tool is inserted into the clearance 82 between the raised portion and the hard board 60 to easily remove the protrusion plate 80 from the mounting member 70. The size of the notches 84 may be suitably designed in consideration of strength of the mounting member 70 required for its automatic mounting and easiness in removing the protrusion plate 80 after reflow soldering.

Figure 13:
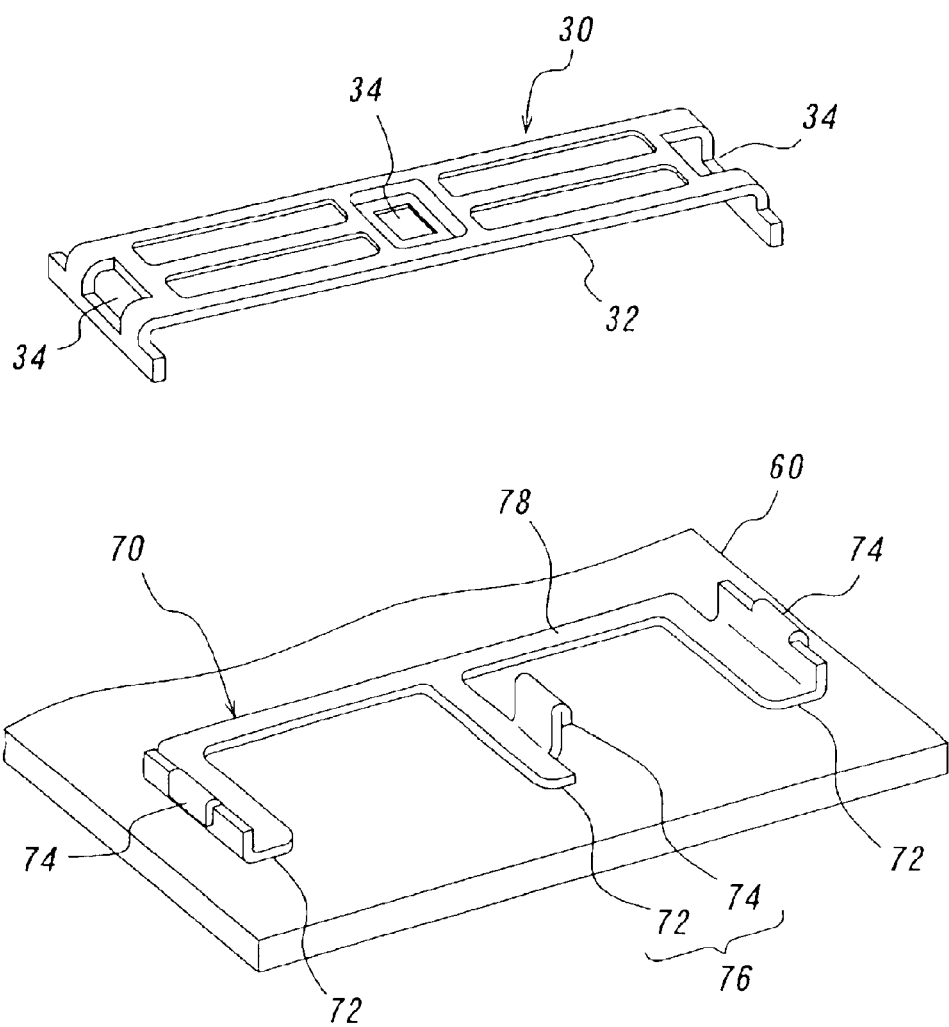
FIG. 13 is a perspective view illustrating a pusher member different from those shown in FIGS. 9 to 12 and a mounting member fixed to a hard board.

FIG. 13 illustrates another pusher member 30 and another mounting member 70 which are substantially similar in construction to those described above. The mounting member 70 shown in FIG. 13 is provided substantially at its mid portion of the connecting member 78 with a mounting portion 76 similar to mounting portions 76 at both the ends of the mounting member 70. On the other hand, the pusher member 30 is provided at its mid portion with an anchor portion 34, other than the anchor portions at both the ends, corresponding to the mounting portion 76 at the mid portions of the mounting member 70.

The reason why such a mounting portion 76 is further provided at the mid portion of the pusher member 30 is that when the distance between the mounting portions 76 at both the ends of the mounting member 70 becomes longer, the force engaging the pusher member 30 with the mounting member 70 will become larger to cause the pusher member 30 to be deformed or warped so that it becomes difficult to maintain the contact between the bump contacts 22 of the flexible printed circuit board 20 and the pads 64 of the hard board 60 at the middle of both the members 30 and 70 with a sufficient force urging the center portions of these members to each other. The engagement of all the anchor portions 34 with all the mounting portions 76 of both the members 30 and 70 sufficiently prevent the pusher member 30 from being deformed to ensure the good contact between the bump contacts 22 and the pads 64 of both the boards 20 and 60, thereby preventing any defective or failed connection between both the boards 20 and 60. Mounting portions 76 may be provided at locations other than at the middle and both the ends depending on the force urging the pusher member 30 against the mounting member 70.

Finally, a method for the mounting member 70 to the hard board 60 by reflow soldering will be explained.

(1) First, the protrusion plate 80 of the mounting member 70 is sucked by means of a suction mounter.
(2) Second, the mounting member 70 is arranged in desired position on the hard board 60.
(3) Third, the mounting member 70 is fixed to the hard board 60 by reflow soldering and thereafter the protrusion plate 80 is removed from the mounting member 70.
(4) The pusher member 30 having the flexible printed circuit board 20 and the elastic member 50 fixed to the pusher member 30 is brought into engagement with the mounting member 70 thus fixed to the hard board 60 to complete the connector 10.

While the invention has been particularly shown and described with reference to the preferred embodiments thereof, it will be understood by those skilled in the art that the foregoing and other changes in form and details can be made therein without departing from the spirit and scope of the invention.

What is claimed is:

1. A connector for connecting a flexible printed circuit board and a hard board, wherein said flexible printed circuit board comprises contact portions, said contact portions each comprise a bump contact thereon, and said flexible printed circuit board is formed with slits between said bump contacts, wherein said connector further comprises a mounting member arranged on said hard board, an elastic member on the surface of said flexible printed circuit board on the opposite side of said bump contacts, and a pusher member for urging said flexible printed circuit board and said elastic member toward said hard board, thereby engaging said pusher member with said mounting member to cause said flexible printed circuit board to connect to said hard board.

2. The connector as set forth in claim 1 wherein two tab portions of said mounting member to be connected to said hard board are made substantially in the same shape as that of land areas of said hard board to be affected by surface tension of molten solder so that the mounting member is positioned in place on said hard board with the aid of self-alignment effect.

3. The connector as set forth in claim 1 wherein said flexible printed circuit board and said elastic member are fixed to each other so that when said pusher member is engaged with said mounting member, said pusher member is accurately held in a desired position relative to said mounting member.

4. The connector as set forth in claim 1 wherein a pushing portion of said pusher member consists of two members adhered together.

5. The connector as set forth in claim 1 wherein said pusher member is provided with anchor portions bent in the form of a U-shape at locations corresponding to engaging portions of said mounting member.

6. A flat and thin connector for connecting a flexible printed circuit board and a hard board, wherein said connector comprises a mounting member arranged on said hard board, bump contacts on contact portions of said flexible printed circuit board, an elastic member on the surface of said flexible printed circuit board on the opposite side of said bump contacts, and a pusher member for urging said flexible printed circuit board and said elastic member toward said hard board, thereby engaging said pusher member with said mounting member to cause said flexible printed circuit board to connect to said hard board, wherein two tab portions of said mounting member to be connected to said hard board are made substantially in the same shape as that of land area of said hard board to be affected by surface tension of molten solder so that the mounting member is positioned in place on said hard board with the aid of self-alignment effect.

7. The connector as set forth in claim 6 wherein said mounting member includes the two tab portions integrally connected.

8. The connector as set forth in claim 6 wherein said hard board is provided with a plurality of circular lands and said mounting member is provided with exposed connecting portions having a shape the same as that of said lands at locations corresponding to said circular lands on said hard board.

9. A flat an thin connector for connecting a flexible printed circuit board and a hard board, wherein said connector comprises a mounting member arranged on said hard board, bump contacts on contact portions of said flexible printed circuit board, an elastic member on the surface of said flexible printed circuit board on the opposite side of said bump contacts, and a pusher member arranged on the rear surface of the printed circuit board for urging said flexible printed circuit board and said elastic member toward said hard board, thereby engaging said pusher member with said mounting member to cause said flexible printed circuit board to connect to said hard board, wherein a pushing portion of said pusher member consists of two members adhered together.

10. The connector as set forth in claim 9 wherein said two members of said pusher member are made of the same material and different in thickness or shape, or said two members are made of different materials and different in thickness or shape.

11. The connector as set forth in claim 10 wherein one of said two members of said pusher member on the side of said elastic member has a curved shape such that the urging force is uniformly distributed.

12. A mounting member comprising a plurality of mounting portions each including a tab portion to be fixed to a hard board and an engaging portion to engage a mating member, and said plurality of mounting portions being integrally connected by a connecting member provided with at least one protrusion plate connected thereto, wherein said protrusion plate is formed so as to provide at least one clearance between said hard board and said protrusion plate at any portion of it.

13. The mounting member as set forth in claim 12 wherein a connecting portion between said protrusion plate and said connecting member is formed with at least one notch.

14. The mounting member as set forth in claim 13 wherein said protrusion plate is removed from said mounting member after said mounting member has been arranged and fixed in a desired place on said hard board by reflow soldering.

15. A flat and thin connector for connecting a flexible printed circuit board and a hard board, wherein said flexible printed circuit board comprises contact portions on its front surface, said contact portions each having a bump contact thereon, and an elastic member on the surface of said flexible printed circuit board on the opposite side of said bump contacts, wherein said hard board comprises contact portions and a mounting member arranged on its front surface, wherein a pusher member is arranged on a rear surface of the printed circuit board to press contact portions of the printed circuit board against contact portions of the hard board in order to electrically connect bump contacts on the printed circuit board and contact pads on the hard boards via said elastic member, and wherein said printed circuit board is provided with slits disposed in a direction parallel to a longitudinal direction of the bump contacts to evenly distribute the pushing force.

16. The connector of claim 15 wherein said flexible printed circuit board is formed with slits between pairs of bump contacts, each pair consisting of two adjacent bump contacts.

17. A connector as claimed in claim 15, wherein said flexible printed circuit board is formed with slits between groups of the bump contacts, each group consisting of three adjacent bump contacts.

* * * * *